United States Patent
Takada et al.

(10) Patent No.: US 8,241,426 B2
(45) Date of Patent: Aug. 14, 2012

(54) CMP POLISHING METHOD, CMP POLISHING APPARATUS, AND PROCESS FOR PRODUCING SEMICONDUCTOR DEVICE

(75) Inventors: Syozo Takada, Ibaraki (JP); Hisanori Matsuo, Kanagawa (JP); Akira Ishikawa, Kanagawa (JP)

(73) Assignees: Nikon Corporation, Tokyo (JP); EBARA Corporation, Tokyo (JP)

( * ) Notice: Subject to any disclaimer, the term of this patent is extended or adjusted under 35 U.S.C. 154(b) by 791 days.

(21) Appl. No.: 11/795,697

(22) PCT Filed: Dec. 21, 2005

(86) PCT No.: PCT/JP2005/024001
§ 371 (c)(1),
(2), (4) Date: May 6, 2008

(87) PCT Pub. No.: WO2006/077730
PCT Pub. Date: Jul. 27, 2006

(65) Prior Publication Data
US 2009/0047785 A1  Feb. 19, 2009

(30) Foreign Application Priority Data

Jan. 21, 2005 (JP) ................................ 2005-013734

(51) Int. Cl.
*B08B 3/12* (2006.01)
*B08B 6/00* (2006.01)
*B08B 7/00* (2006.01)
*B08B 7/02* (2006.01)

(52) U.S. Cl. ................ 134/1; 134/1.1; 134/1.2; 134/1.3

(58) Field of Classification Search .................. None
See application file for complete search history.

(56) References Cited

U.S. PATENT DOCUMENTS

| | | | | | |
|---|---|---|---|---|---|
| 5,855,811 | A | * | 1/1999 | Grieger et al. | 252/79.3 |
| 5,968,280 | A | * | 10/1999 | Ronay | 134/2 |
| 6,123,088 | A | * | 9/2000 | Ho | 134/1.3 |
| 7,344,988 | B2 | * | 3/2008 | Chelle | 438/692 |
| 2003/0201000 | A1 | * | 10/2003 | Worm et al. | 134/32 |

FOREIGN PATENT DOCUMENTS

EP  0986096  3/2000
(Continued)

OTHER PUBLICATIONS

Chen et al., "The Leakage Current Conduction Mechanisms of Cu/Porous Silica Damascene Schemes with Nano-cluster TaSix Barrier", Jpn. J. Appl. Phys., 44: 102-107 (2005).

*Primary Examiner* — Duy Deo
(74) *Attorney, Agent, or Firm* — Morgan, Lewis & Bockius LLP

(57) ABSTRACT

When the remaining slurry and polishing residue are removed by cleaning with a cleaning liquid (preferably a cleaning liquid containing a surfactant), organic matter in the cleaning liquid containing a surfactant seeps into the interlayer insulating film 3. Therefore, the substrate is subsequently washed with an organic solvent or a solution containing an organic solvent, thus washing away the organic matter that has seeped into the interlayer insulating film 3. Although the interlayer insulating film 3 is subjected to a hydrophobic treatment, since the solvent used is an organic solvent, this solvent is able to seep into the interlayer insulating film 3, dissolve the organic matter, and wash the organic matter away without being affected by this hydrophobic treatment. Afterward, the substrate 1 is dried, and the organic solvent or solution containing an organic solvent that is adhering to the surface is removed.

5 Claims, 7 Drawing Sheets

(a)

(b)

FOREIGN PATENT DOCUMENTS

| | | |
|---|---|---|
| EP | 1466963 | 10/2004 |
| JP | 7-211681 | 8/1995 |
| JP | 11-044443 | 2/1999 |
| JP | 2002-110679 | 4/2002 |
| JP | 2004-182773 | 7/2004 |
| JP | 2004-307725 | 11/2004 |
| JP | 2005-026277 | 1/2005 |

* cited by examiner (a)　　　　　　　　　(b)

To vacuum pump (a)     (b)

CMP POLISHING METHOD, CMP POLISHING APPARATUS, AND PROCESS FOR PRODUCING SEMICONDUCTOR DEVICE

TECHNICAL FIELD

The present invention relates to a CMP polishing method for removing wiring materials and barrier metals by CMP polishing in cases where hydrophobized porous substances (ordinarily called porous low-k materials) are used as interlayer insulating film materials of semiconductor integrated circuits formed on a substrate, a CMP polishing apparatus that is capable of using this CMP polishing method, and a semiconductor device manufacturing method using this CMP polishing method.

BACKGROUND ART

The introduction of materials with a low dielectric constant (low-k materials) as interlayer insulating films has been investigated because of the requirements for reduced power consumption and increased speed in semiconductor devices. Furthermore, planarization by CMP (chemical mechanical polishing) methods and the formation of wiring by damascene processes have become essential processes because of the requirements for finer wiring and multilayer wiring that accompany an increase in the degree of integration and a reduction in chip size.

FIG. 8 shows a process in which a trench is formed in an interlayer insulating film made of a hydrophobized porous substance ($SiO_2$) that is formed on a substrate, and copper wiring embedded inside the trench is removed by CMP polishing.

FIG. 8(a) shows the state prior to the CMP polishing of the copper wiring part. An etching stopper 52 is formed on top of lower-layer wiring 51, and an interlayer insulating film 53 made of a hydrophobized porous substance is formed on top of this. A cap film 54 which is used to prevent the flow of any slurry or cleaning liquid containing surfactants into the interlayer insulating film 53 is formed on top of the interlayer insulating film 53. The cap film 54 is formed from $SiO_2$, SiOC, SiC, or the like. An anti-diffusion layer 55 constituting a barrier metal is formed so as to cover the cap film 54 and the trench part from which the interlayer insulating film 53 has been removed, and copper 56 which forms wiring is formed on top of this and embedded in the trench part. The anti-diffusion layer 55 prevents the copper 56 from diffusing into the interlayer insulating film 53, and has a two-layer structure of Ta and TaN.

From the state shown in FIG. 8(a), the copper 56 of the upper-layer part and the anti-diffusion layer 55 are removed by CMP polishing, and only the copper 56 of the trench part is left as wiring as shown in FIG. 8(b). Subsequently, the slurry and polishing residue remaining on the surface, and metal contaminants, are removed by cleaning the surface with a cleaning liquid containing surfactants. In this case, the cap film 54 acts to prevent the cleaning liquid from entering the interlayer insulating film 53. Afterward, the cleaning liquid containing surfactants is removed by rinsing with water or washing with running water, and the substrate is then finally dried.

However, in order to achieve even higher-speed operation and lower power consumption of semiconductor devices, it is necessary to reduce the thickness of the cap film 54 or eliminate the cap film 54, thus reducing the electrostatic capacitance of this part. Of course no cap film 54 is formed in cases where the cap film 54 is eliminated, but also even in cases where the thickness of the cap film 54 is reduced, the cap film 54 is formed in a mottled form, so that portions where no cap film 54 is formed may be generated depending on the location. Consequently, the following problem arises: namely, the slurry and the cleaning liquid containing surfactants seep into the interlayer insulating film 53, which is porous.

It is difficult to remove the slurry and cleaning liquid containing surfactants that have seeped into the interlayer insulating film 53 by the washing with water that is subsequently performed. The reason for this is that these substances contain organic matter, and not only is this difficult to remove by washing with water, but the interlayer insulating film 53 has also been subjected to a hydrophobic treatment. This hydrophobic treatment is a treatment that is performed in order to ensure that moisture will not seep into the interlayer insulating film 53 in subsequent processes, and is accomplished by substituting the OH groups formed on the terminal portions of the porous $SiO_2$ forming the interlayer insulating film 53 with methyl groups or the like.

DISCLOSURE OF THE INVENTION

The present invention was devised in light of such circumstances; it is an object of the present invention to provide a CMP polishing method in which organic substances that have seeped into the interlayer insulating film can be efficiently removed after the slurry and polishing residue remaining on the surface of the substrate are removed by cleaning with a cleaning liquid containing surfactants following the performance of CMP polishing for the purpose of removing wiring materials and barrier metals in cases where a hydrophobized porous substance is used as the interlayer insulating film material of a semiconductor integrated circuit formed on a substrate, a CMP polishing apparatus which is capable of using this CMP polishing method, and a semiconductor device manufacturing method using this CMP polishing method.

The first invention that is used to achieve the object described above is a CMP polishing method in which CMP polishing for the purpose of removing wiring materials and barrier metals is performed in a case where a hydrophobized porous substance is used as an interlayer insulating film material in a semiconductor integrated circuit formed on a substrate, the slurry and polishing residue remaining on the surface of the substrate is then removed by cleaning with a cleaning liquid, and the surface of the substrate is then subjected to a washing treatment with an organic solvent or a solution containing an organic solvent, or a heat treatment, or both.

In the present invention, a washing treatment with an organic solvent or a solution containing an organic solvent, or a heat treatment, or both, are performed. As will be described later in the embodiments, as a result of washing using an organic solvent or a solution containing an organic solvent, organic substances that have seeped into the interlayer insulating film can be efficiently removed by washing. In cases where a solution containing an organic solvent is used for washing, the effect is reduced if the concentration of the organic solvent is low. However, the minimum concentration can be appropriately determined in accordance with the type of solution containing an organic solvent that is used.

Moreover, organic substances that have seeped into the interlayer insulating film can be thermally decomposed and removed as gases by performing a heat treatment. In this case, it is necessary that the heating temperature be equal to or greater than the temperature at which the organic substances that have seeped into the interlayer insulating film undergo thermal decomposition; this temperature can be appropriately determined, and a higher temperature results in better efficiency.

However, it is necessary that this temperature be set at a temperature that is equal to or less than the temperature at which there is no effect on the performance of the semiconductor device that is formed.

Furthermore, in cases where both a heat treatment and washing using an organic solvent or a solution containing an organic solvent are performed, drying of the substrate that has been wet by the washing treatment can be simultaneously accomplished by performing the heat treatment after the washing treatment. Moreover, in cases where a pre-baking treatment of the substrate is performed in a later process, the heat treatment can also be substituted for this pre-baking treatment; in this case, the pre-baking treatment of the substrate corresponds to the heat treatment in the claims.

In addition, in cases where a heat treatment alone is performed prior to the washing treatment using an organic solvent or a solution containing an organic solvent, washing with water may also be performed after the slurry and polishing residue remaining on the surface of the substrate have been removed by cleaning with a cleaning liquid in the same manner as in conventional techniques prior to the heat treatment. Such cases are also included in the claims. In this case, it is desirable that the cleaning liquid be a liquid that contains a surfactant.

The second invention that is used to achieve the object described above is the first invention, wherein a solvent containing at least one type of organic solvent selected from a set comprising alcohols, aldehydes, ketones, esters, ethers, amides, polyhydric alcohols and derivatives of the same, nitrogen-containing organic compounds, hydrocarbons, halogenated hydrocarbons, and fluorine compounds is used as the organic solvent described above.

Among these organic solvents, alcohols, aldehydes, ketones, esters, ethers, amides, polyhydric alcohols and derivatives of the same, and nitrogen-containing organic compounds will dissolve both water and organic matter, and are therefore especially desirable as the organic solvent used in cleaning. Furthermore, among these organic solvents, the solubility of organic matter is especially high in the case of hydrocarbons, halogenated hydrocarbons, and fluorine compounds; accordingly, these solvents are especially desirable as organic substances used for the removal of organic matter.

The third invention that is used to achieve the object described above is the first invention, wherein the heat treatment is a heat treatment performed under reduced pressure.

Copper wiring is exposed at the surface of the substrate, and there is a danger that this wiring will be oxidized when the heat treatment is performed. Accordingly, in order to prevent oxidation of the copper, it is desirable that a heat treatment performed under reduced pressure be used as the heat treatment.

The fourth invention that is used to achieve the object described above is the first invention, wherein the substrate is placed in an inert gas during the heat treatment.

In order to prevent oxidation of the copper that accompanies the heat treatment as described above, it is even more desirable that the substrate be placed in an inert gas such as $N_2$, Ar or He gas during the heat treatment.

The fifth invention that is used to achieve the object described above is a CMP polishing apparatus which has a washing treatment device that performs a washing treatment using an organic solvent or a solution containing an organic solvent on the substrate from which the slurry and polishing residue remaining on the surface following CMP polishing have been removed by cleaning with a cleaning liquid.

In the present invention, a washing treatment device is attached to the CMP polishing apparatus; accordingly, the CMP operation (up to cleaning with a cleaning liquid) and a washing treatment using an organic solvent or a solution containing an organic solvent can be performed as a single series of processes.

The sixth invention that is used to achieve the object described above is a CMP polishing apparatus which has a heat treatment device that performs a heat treatment on the substrate from which the slurry and polishing residue remaining on the surface following CMP polishing have been removed by cleaning with a cleaning liquid.

In the present invention, a heat treatment device is attached to the CMP polishing apparatus; accordingly, the CMP operation (up to cleaning with a cleaning liquid) and a heat treatment can be performed as a single series of processes.

The seventh invention that is used to achieve the object described above is a CMP polishing apparatus which has a washing treatment device that performs a washing treatment using an organic solvent or a solution containing an organic solvent on the substrate from which the slurry and polishing residue remaining on the surface following CMP polishing have been removed by cleaning with a cleaning liquid, and a heat treatment device that performs a heat treatment on this substrate.

In the present invention, a washing treatment device and a heat treatment device are attached to the CMP polishing apparatus; accordingly, the CMP operation (up to cleaning with a cleaning liquid), a washing treatment using an organic solvent or a solution containing an organic solvent, and a heat treatment can be performed as a single series of processes.

The eighth invention that is used to achieve the object described above is a semiconductor device manufacturing method having a process in which wiring materials and barrier metals are removed using the CMP polishing method of any of the first through fourth inventions.

In the present invention, organic substances can be prevented from seeping into the porous interlayer insulating film; accordingly, the performance of the semiconductor devices can be improved.

BEST MODE FOR CARRYING OUT THE INVENTION

Figure 1:
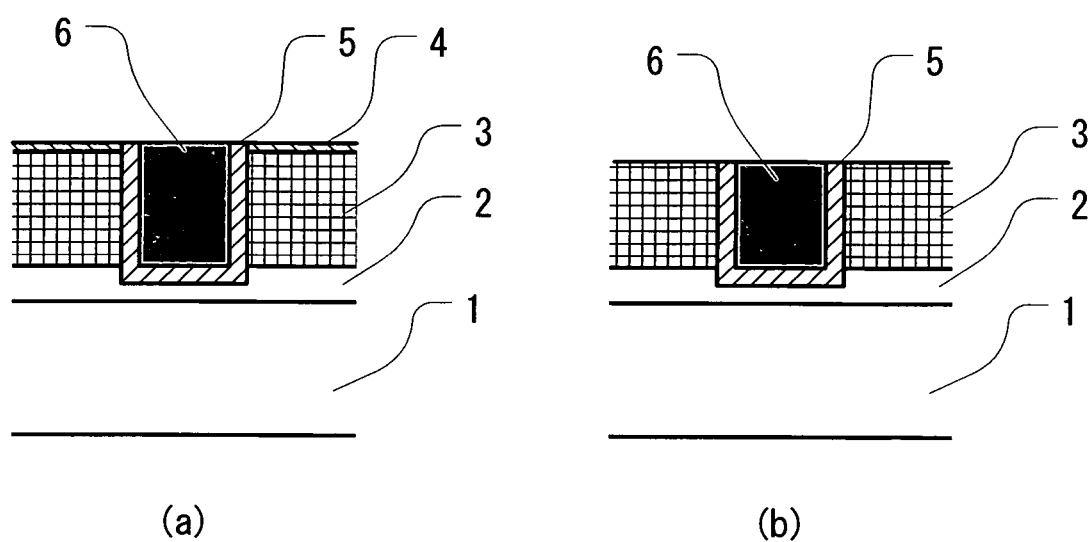
FIG. 1 is a diagram showing an outline of a substrate using a CMP polishing method constituting a working configuration of the present invention; this diagram shows a state in which CMP polishing has been completed.
Figure 8:
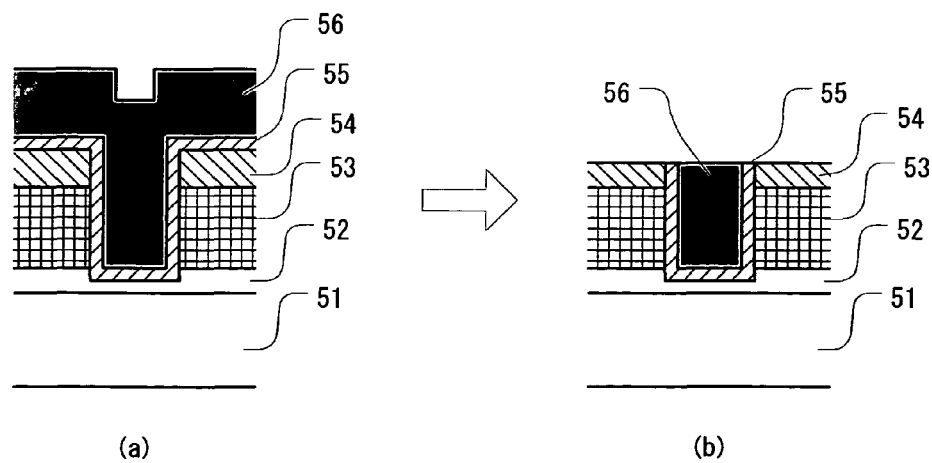
FIG. 8 is a diagram showing a process in which a trench is formed in an interlayer insulating film made of a hydrophobized porous substance that is formed on a substrate, and copper wiring embedded inside the trench is removed by CMP polishing.

Working configurations of the present invention will be described below using the figures. FIG. 1 is a diagram showing an outline of a substrate using a CMP polishing method constituting a working configuration of the present invention; this diagram shows a state in which CMP polishing has been completed. In FIG. 1(a), an etching stopper 2 is formed on top of lower-layer wiring 1, and an interlayer insulating film 3 made of a hydrophobized porous substance ($SiO_2$) is formed on top of this. A cap film 4 is disposed on top of the interlayer insulating film 3. The cap film 4 is formed from $SiO_2$, SiOC, SiC, or the like. An anti-diffusion layer 5 is disposed so as to cover a trench part from which the interlayer insulating film 3 has been removed, and copper 6 constituting wiring is embedded in this trench part. The anti-diffusion layer 5 comprises a two-layer structure of Ta and TaN. This structure is basically the same as that shown in FIG. 8(b); however, since the cap film 4 is thin (approximately 20 nm), the cap film 4 does not completely cover the surface of the interlayer insulating film 3, and there are portions in which the interlayer insulating film 3 is exposed in scattered locations. The structure shown in FIG. 1(b) differs from that shown in FIG. 1(a) only in that no cap film 4 is formed.

In both structures, at least a portion of the interlayer insulating film 3 is exposed at the surface; accordingly, organic matter in the polishing slurry seeps into the interlayer insulating film 3. The remaining slurry and polishing residue are removed by cleaning these substrates with a cleaning liquid containing a surfactant in the same manner as in a conventional method. Consequently, organic matter in the cleaning liquid containing a surfactant seeps into the interlayer insulating film 3. The interlayer insulating film 3 is subjected to a hydrophobic treatment; however, since the hydrophobicity is weakened by the action of the surfactant, organic matter especially tends to seep into the interlayer insulating film 3 in this process.

In the CMP polishing method constituting a first working configuration of the present invention, organic matter that has seeped into the interlayer insulating film 3 is subsequently removed by cleaning, which is accomplished by washing the substrate with an organic solvent or a solution containing an organic solvent. The interlayer insulating film 3 is subjected to a hydrophobic treatment; however, since the solvent used is an organic solvent, this solvent is able to seep into the interlayer insulating film 3, dissolve the organic matter, and wash the organic matter away without being affected by this hydrophobic treatment. Afterward, the substrate is dried, and the organic solvent or solution containing an organic solvent that is adhering to the surface is removed. With regard to the drying method used, drying may be accomplished by spin drying, or heating may be performed to a certain extent; drying may also be accomplished by blowing nitrogen. Heating and gas blowing may also be performed simultaneously.

Examples of organic solvents that can be used include solvents that can dissolve both water and organic matter; for instance, alcohols that can be used include propenyl alcohol, isopropyl alcohol, ethanol, 1-propanol, methanol, 1-hexanol, and the like, aldehydes that can be used include acetylaldehyde and the like, ketones that can be used include acetone, diacetone alcohol, methyl ethyl ketone, and the like, esters that can be used include ethyl formate, propyl formate, ethyl acetate, methyl acetate, methyl lactate, butyl lactate, ethyl lactate, and the like, ethers that can be used include sulfoxides such as dimethyl sulfoxide, tetrahydrofuran, dioxane, diglyme, and the like, amides that can be used include N, N-dimethylformamide, dimethylimidazolidinone, N-methylpyrrolidone, and the like, polyhydric alcohols and derivatives of the same that can be used include ethylene glycol, glycerol, diethylene glycol, diethylene glycol monomethyl ether, and the like, and nitrogen-containing organic compounds that can be used include acetonitrile, amylamine, isopropylamine, imidazole, dimethylamine, and the like. Furthermore, organic solvents in which the solubility of organic matter is high may be cited as examples; e.g., hydrocarbons that can be used include mesitylene, pentane, hexane, octane, benzene, toluene, xylene, diethylbenzene, and the like, halogenated hydrocarbons that can be used include methylene chloride, methyl chloride, carbon tetrachloride, and the like, and fluorine compounds that can be used include trifluoroethanol, hexafluorobenzene, and the like.

Furthermore, in order to prevent any residue of the organic solvent itself, it is desirable that the boiling point of the organic solvent used be 300° C. or less. A boiling point of 200° C. or less is even more desirable.

In this washing by means of an organic solvent or a solution containing an organic solvent, in order to remove organic adhering matter adhering to the interlayer insulating film 3 with good efficiency, heating of the organic solvent or cleaning by scrubbing with a cleaning brush may be performed, or cleaning may be assisted by applying an ultrasonic vibration of 1 MHz or greater.

Furthermore, the system may also be constructed so that the substrate is cleaned with a solution containing a surfactant, and then washed with water, in the same manner as in a conventional method prior to washing with an organic solvent or a solution containing an organic solvent.

In a CMP polishing method constituting a second working configuration of the present invention, a substrate in the state shown in FIG. 1 is washed with an organic solvent or a solution containing an organic solvent in the same manner as in a conventional technique, and the organic matter that has seeped into the interlayer insulating film 3 is then thermally decomposed and removed by performing a heat treatment. Specifically, the organic matter that has seeped into the interlayer insulating film 3 is thermally decomposed by heating the substrate to a temperature that is equal to or greater than the thermal decomposition temperature of this organic matter. A higher heating temperature is more efficient; however, it is necessary that this temperature be equal to or less than the maximum temperature at which there is no disruption of the function of the semiconductor device. Ordinarily, this temperature is a temperature of 400° C. or less. The reason that the heat treatment and the heating that is performed for the purpose of drying as described above are different is as follows: namely, in the case of the heat treatment, heating is performed to a temperature at which decomposition of the organic matter occurs, while in the case of heating for the purpose of drying, heating is not performed to such a high temperature, but is performed only to cause evaporation of the organic solvent or solution containing an organic solvent.

In order to prevent oxidation of the copper constituting the wiring material during the heat treatment, it is desirable that heating be performed under reduced pressure, or that heating be performed in an inert gas such as $N_2$, Ar or He. Heating may also be performed under reduced pressure and in an inert gas.

Furthermore, favorable results are obtained if a heat treatment is further performed following the washing treatment with an organic solvent or a solution containing an organic solvent described in the first working configuration. Moreover, in cases where only a heat treatment is performed, washing with water may be performed after the substrate has been cleaned with a solution containing a surfactant in the same manner as in a conventional method, and the heat treatment may then be performed after this.

In addition, in cases where a pre-baking process of the substrate is performed following the CMP polishing process, this pre-baking process may also be utilized as a heat treatment.

Figure 2:
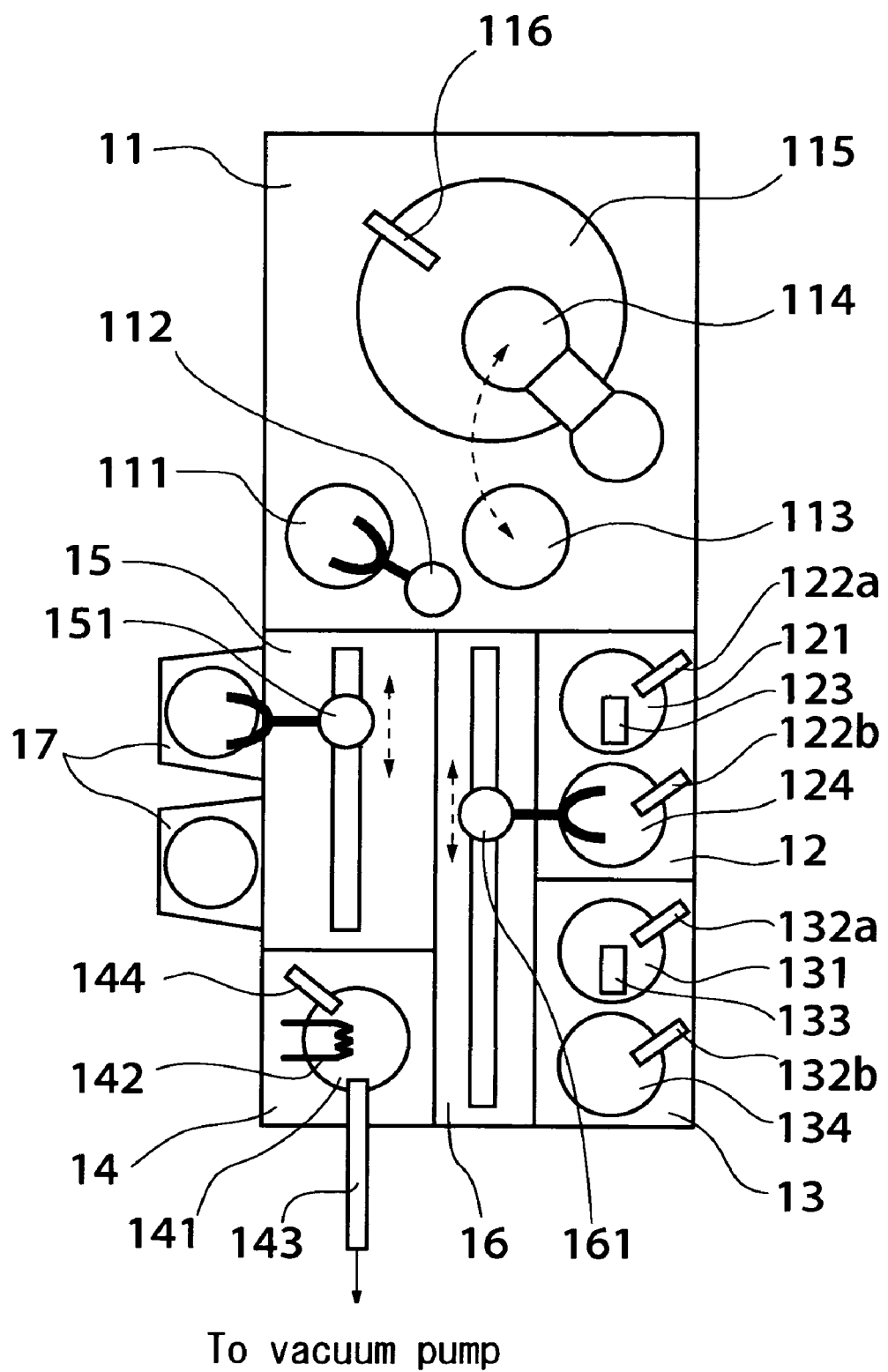
FIG. 2 is a diagram showing an outline of the CMP polishing apparatus constituting a working configuration of the present invention.

A CMP polishing apparatus constituting one working configuration of the present invention will be described below using FIG. 2. The CMP polishing apparatus constituting this working configuration is constructed from a polishing part 11, an abrasive grain metal contamination cleaning part 12, an organic solvent washing part 13, a wafer heat treatment part 14, a first conveying part 15, and a second conveying part 16. The respective parts are separated by partition walls.

A CMP polishing mechanism comprising a polishing table 115 and a polishing head 114 which presses the semiconductor wafer against the polishing table while holding this wafer is installed in the polishing part 11. The polishing table 115 is connected to a motor; furthermore, a polishing cloth is bonded to the upper surface of this polishing table 115. Moreover, the polishing head 114 comprises a motor used for rotation and a raising-and-lowering cylinder, and can therefore be raised and lowered; in addition, the polishing head 114 can rotate about its own axial center. The system is devised so that an abrasive liquid containing a polishing agent is supplied to the surface of the polishing table 115 from a slurry supply nozzle 116.

Meanwhile, the supply of the semiconductor wafer to the polishing mechanism is accomplished as follows: namely, the semiconductor wafer placed in a wafer cassette 17 is taken out and passed on to a first temporary placing stand 111 by a wafer conveying robot 151, and is passed on to a second temporary placing stand 113 in a state in which the semiconductor wafer is inverted by a wafer conveying robot 112 comprising a wafer inverting mechanism so that the polishing surface is facing downward. Subsequently, the polishing head 114 turns so that the semiconductor wafer is transferred to the polishing head.

The semiconductor wafer that is polished by being held by the polishing head 114 and pressed against the polishing table 115 is conveyed to the second temporary placing stand 113 following the completion of the polishing in a state in which this wafer is held by the polishing head 114. Then, the semiconductor wafer is separated from the polishing head 114 and placed on the second temporary stand 113. Next, this semiconductor wafer is inverted by a wafer conveying robot 161 having a wafer inverting mechanism, and is then conveyed to the abrasive grain metal contamination cleaning part 12.

The abrasive grain metal contamination cleaning part 12 comprises an abrasive grain metal contamination cleaning chamber 121 in which the cleaning of abrasive grain metal contamination of the semiconductor wafer is performed, and a spin dry chamber 124 in which the semiconductor wafer is rinsed and dried. In the abrasive grain metal contamination cleaning chamber 121, cleaning is performed by pressing a sponge roller 123 against the semiconductor wafer while holding and rotating the outer circumferential part of this semiconductor wafer and supplying a cleaning liquid from a cleaning chemical supply nozzle 122a.

Then, the semiconductor wafer in which the cleaning of abrasive grain metal contamination has been completed is conveyed to the spin dry chamber 124 by the wafer conveying robot 161. In the spin dry chamber 124, rinsing is performed by supplying pure water from a rinsing liquid supply nozzle 122b while holding and rotating the outer circumferential part of this semiconductor wafer; next, the semiconductor wafer is rotated at a high speed, and spin drying is performed. The semiconductor wafer in which the cleaning of abrasive grain metal contamination and drying have been completed is again conveyed by the wafer conveying robot 161 to the organic solvent washing part 13.

The organic solvent washing part 13 comprises an organic solvent washing chamber 131 in which washing of the semiconductor wafer with an organic solvent is performed and a spin dry chamber 134 in which drying of the semiconductor wafer is performed. In the organic solvent washing chamber 131, washing is performed by pressing a sponge roller 133 against the semiconductor wafer while holding and rotating the outer circumferential part of the semiconductor wafer and supplying an organic solvent from an organic solvent supply nozzle 132a.

Then, the semiconductor wafer in which the washing with an organic solvent has been completed is conveyed to the spin dry chamber 134 by the wafer conveying robot 161. In the spin dry chamber 134, rinsing is performed by supplying an organic solvent for rinsing from an organic solvent supply nozzle 132b while holding and rotating the outer circumferential part of this semiconductor wafer; next, the semiconductor wafer is rotated at a high speed, and spin drying is performed. The semiconductor wafer in which the washing with an organic solvent and drying have been completed is again conveyed by the wafer conveying robot 161 to the wafer heat treatment part 14.

The wafer heat treatment part 14 is constructed from a heating mechanism 142 that heats the semiconductor wafer and a wafer heating chamber 141 that comprises an exhaust line 143 which evacuates the wafer heating chamber 141 and a gas introduction line 144 which introduces an inert gas into the wafer heating chamber 141. In the wafer heating chamber 141, after the wafer is conveyed to a wafer holding stand by the wafer conveying robot 161 and held there, the wafer heating chamber 141 is closed, and the pressure inside the wafer heating chamber 141 is reduced by a vacuum pump via the exhaust line 143. Afterward, an inert gas is introduced into the wafer heating chamber 141 via the gas introduction line 144, and the heat treatment of the semiconductor wafer is performed by the heating mechanism 142. The semiconductor wafer in which the heat treatment has been completed is again accommodated in a wafer cassette 17 by the wafer conveying robot 151.

In the processes described above, a heat treatment is performed in the wafer heat treatment part 14 following washing using an organic solvent in the organic solvent washing part 13. However, it would also be possible to omit the heat treatment by operating the wafer conveying robot 161 and to accommodate the wafer that has been washed by an organic solvent in the wafer cassette 17 again by the wafer conveying robot 151. Conversely, the system may also be devised so that washing by an organic solvent is not performed in the organic solvent washing part 13, and the wafer in which the cleaning has been completed in the abrasive grain metal contamination cleaning part 12 is conveyed to the wafer heat treatment part 14 by the wafer conveying robot 161 and subjected to a heat treatment, and is then accommodated in the wafer cassette 17 again by the wafer conveying robot 151.

Figure 3:
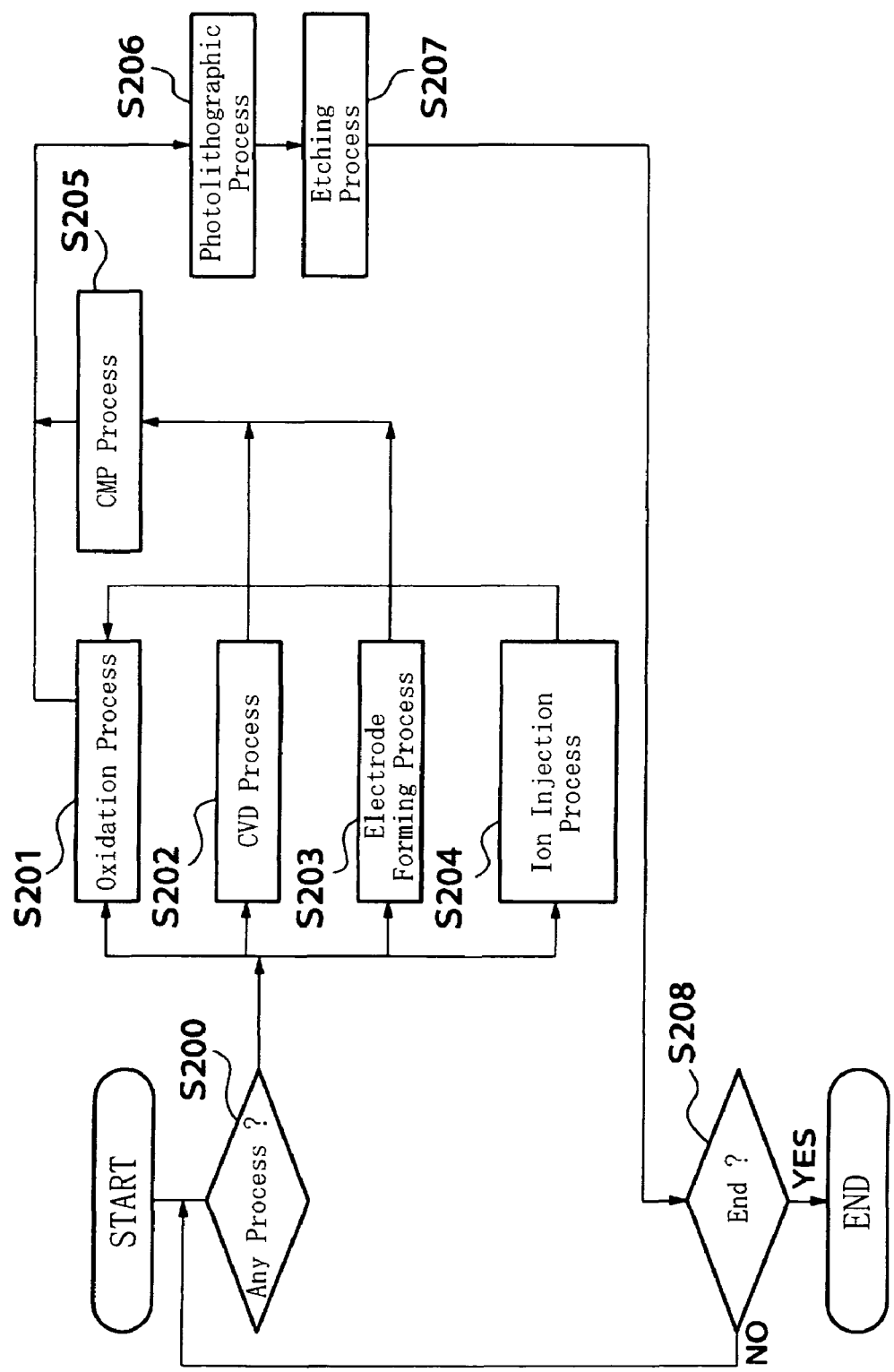
FIG. 3 is a diagram showing the processes in a semiconductor device manufacturing method constituting a working configuration of the present invention.

FIG. 3 is a diagram showing a semiconductor device manufacturing method constituting a working configuration of the present invention. When the semiconductor device manufacturing process is started, the appropriate treatment process is first selected in step S200 from the following steps S201 through S204. Then, the processing proceeds to one of the steps.

Here, step S201 is an oxidation process in which the surface of the wafer is oxidized. Step S202 is a CVD process in which an insulating film or dielectric film is formed on the surface of the wafer by CVD or the like. Step S203 is an electrode formation process in which electrodes are formed on the wafer by vacuum evaporation or the like. Step S204 is an ion injection process in which ions are injected into the wafer.

Following the CVD process (S202) or electrode formation process (S203), the processing proceeds to step S205. Step S205 is a CMP process. In the CMP process, the planarization of interlayer insulating films, the formation of a damascene by the polishing of a metal film or the polishing of a dielectric film on the surface of the semiconductor device, and the like are performed using the polishing apparatus according to the present invention.

Following the CMP process (S205) or oxidation process (S201), the processing proceeds to step S206. Step S206 is a photolithographic process. In this process, the coating of the wafer with a resist, the burning of a circuit pattern onto the wafer by exposure using an exposure apparatus, and the development of the exposed wafer are performed. Furthermore, the subsequent step S207 is an etching process in which the portions other than the developed resist image are removed by etching, the resist is then stripped away, and the unnecessary resist following the completion of etching is removed.

Next, in step S208, a judgment is made as to whether or not all of the required processes have been completed. If the processes have not been completed, the processing returns to step S200, and the preceding steps are repeated so that a circuit pattern is formed on the wafer. If it is judged in step S208 that all of the processes have been completed, the processing is ended.

In the semiconductor device manufacturing method according to the present invention, since the CMP polishing method of the present invention is used in the CMP process, the leakage current density between wires can be reduced, so that semiconductor devices having a more favorable performance can be manufactured.

EMBODIMENTS

Examples in which substrates that are polished as shown in FIG. 1(a) are subjected to treatments such as those indicated in the working configurations of the present invention will be described below along with comparative examples.

Embodiment A

A substrate having an interlayer insulating film 3 that uses a silica film having an aperiodic structure as a hydrophobized porous substance was immersed for one minute in an aqueous solution of trimethylammonium hydroxide containing a surfactant, which is generally labeled as a particle contamination removal cleaning liquid for cleaning following CMP, and the slurry and polishing residue were removed. Subsequently, the following treatments were performed:

Embodiment A1

A substrate was immersed for eight minutes in an ethanol solution, which is a solution containing an organic solvent, so that the organic matter that had entered the interlayer insulating film 3 was removed, after which the surface of the substrate was dried by dry nitrogen gas blowing.

Embodiment A2

A substrate was immersed for eight minutes in pure water and washed, and the surface of the substrate was then dried by dry nitrogen gas blowing; furthermore, this substrate was then placed in a He atmosphere at 665 Pa and subjected to a heat treatment at 380° C. for five minutes.

Embodiment A3

A substrate was immersed for eight minutes in an ethanol solution, which is a solution containing an organic solvent, so that the organic matter that had entered the interlayer insulating film 3 was removed, after which the surface of the substrate was dried by dry nitrogen gas blowing. Furthermore, this substrate was then placed in a He atmosphere at 665 Pa and subjected to a heat treatment at 380° C. for five minutes.

Comparative Example A

A substrate was immersed for eight minutes in pure water and washed, and the surface of the substrate was then dried by dry nitrogen gas blowing (this is the same method as in a conventional method).

Figure 4:
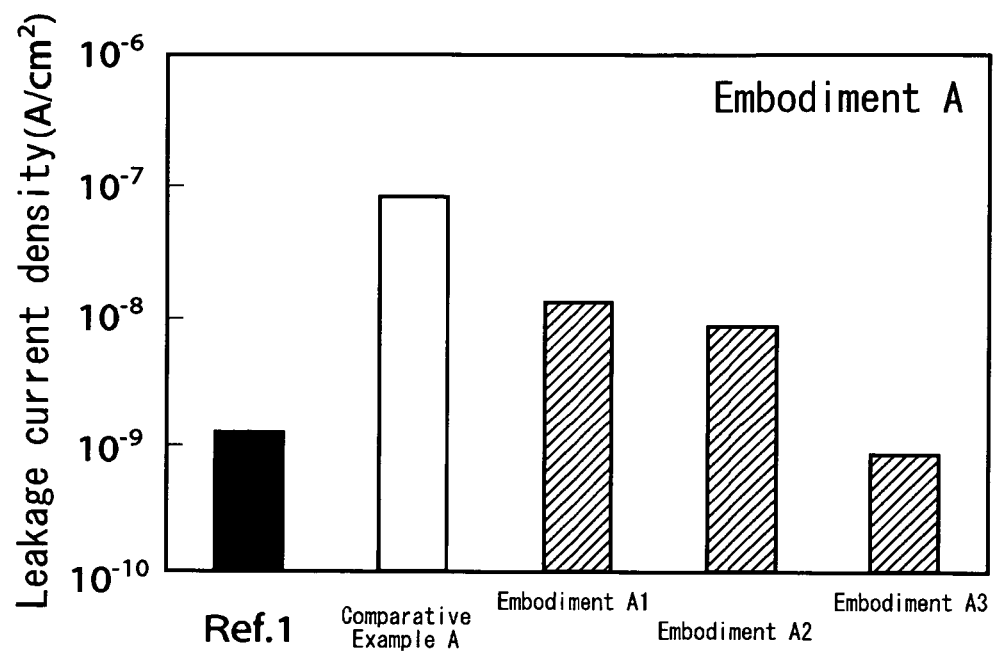
FIG. 4 is a diagram showing the leakage current density of the substrate in Embodiment A.

FIG. 4 shows the leakage current density in the substrate obtained by performing the treatments in the respective embodiments and comparative example in cases where an electric field of 1 MV/cm was applied. Furthermore, the leakage current density indicated as the reference (Ref. 1) is a leakage current density prior to the immersion into the aqueous solution of trimethylammonium hydroxide containing a surfactant following the completion of CMP polishing.

In the state referred to as the reference, it was possible to suppress the leakage current density to a low value. In Comparative Example A, however, the leakage current density rises to approximately $10^{-7}$ [A/cm$^2$]. The reason for this is that the organic matter in the aqueous solution of trimethylammonium hydroxide containing a surfactant seeped into the interlayer insulating film made of a porous material. However, in Embodiment A1 and Embodiment A2, the leakage current density was approximately $10^{-8}$ [A/cm$^2$], which is about 1/10 of that in the comparative example. In Embodiment A3, furthermore, the leakage current density was approximately $10^{-9}$ [A/cm$^2$], which indicates an amelioration to a value that is about 1/100 of that in the comparative example.

Embodiment B

Figure 5:
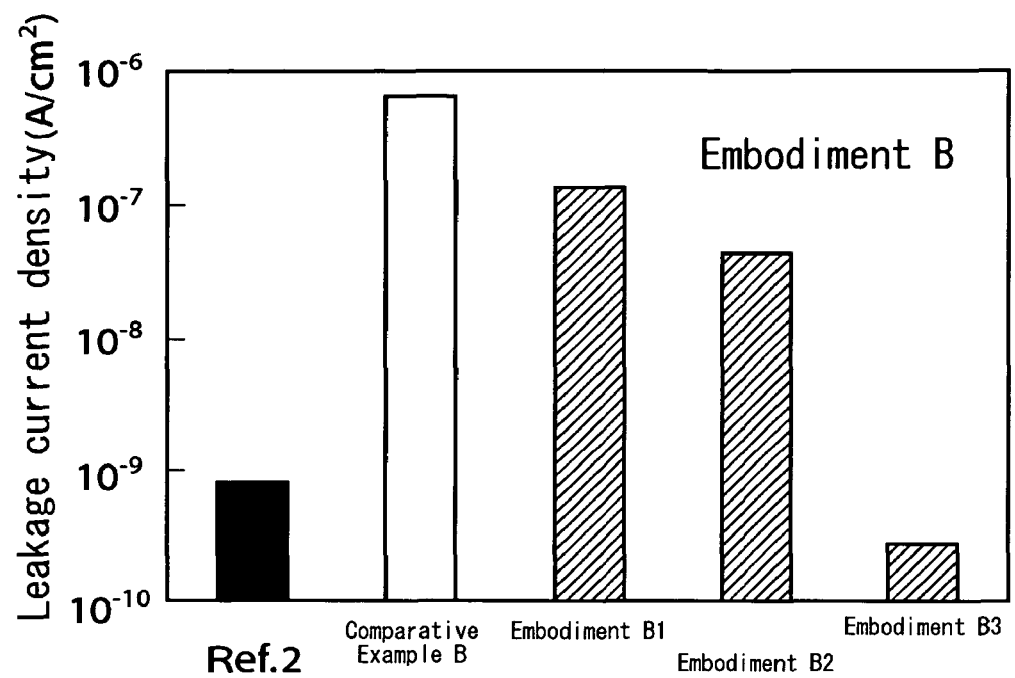
FIG. 5 is a diagram showing the leakage current density of the substrate in Embodiment B.

A substrate having an interlayer insulating film 3 that uses a silica film having a periodic structure as a hydrophobized porous substance was immersed for one minute in an aqueous solution of trimethylammonium hydroxide containing a surfactant, which is generally labeled as a particle contamination removal cleaning liquid for cleaning following CMP, and the slurry and polishing residue were removed. Subsequently, the following treatments were performed:
(Embodiment B1)→the same treatment as in Embodiment A1
(Embodiment B2)→the same treatment as in Embodiment A2
(Embodiment B3)→the same treatment as in Embodiment A3
(Comparative Example B)→the same treatment as in Comparative Example A FIG. 5 shows the leakage current density in the substrate obtained by performing the treatments in the respective embodiments and comparative example in cases where an electric field of 1 MV/cm was applied. Furthermore, the leakage current density indicated as the reference (Ref 2) is a leakage current density prior to the immersion into the aqueous solution of trimethylammonium hydroxide containing a surfactant following the completion of CMP polishing.

In the state referred to as the reference, it was possible to suppress the leakage current density to a low value. In Comparative Example B, however, the leakage current density rises to approximately $10^{-6}$ [A/cm$^2$]. The reason for this is that the organic matter in the aqueous solution of trimethylammonium hydroxide containing a surfactant seeped into the interlayer insulating film made of a porous material. However, in Embodiment B1 and Embodiment B2, the leakage current density was approximately $10^{-7}$ [A/cm$^2$], which is about 1/10 of that in the comparative example. In Embodiment B3, furthermore, the leakage current density was approximately $10^{-9}$ [A/cm$^2$], which indicates an amelioration to a value that is about 1/1000 of that in the comparative example.

Embodiment C

Figure 6:
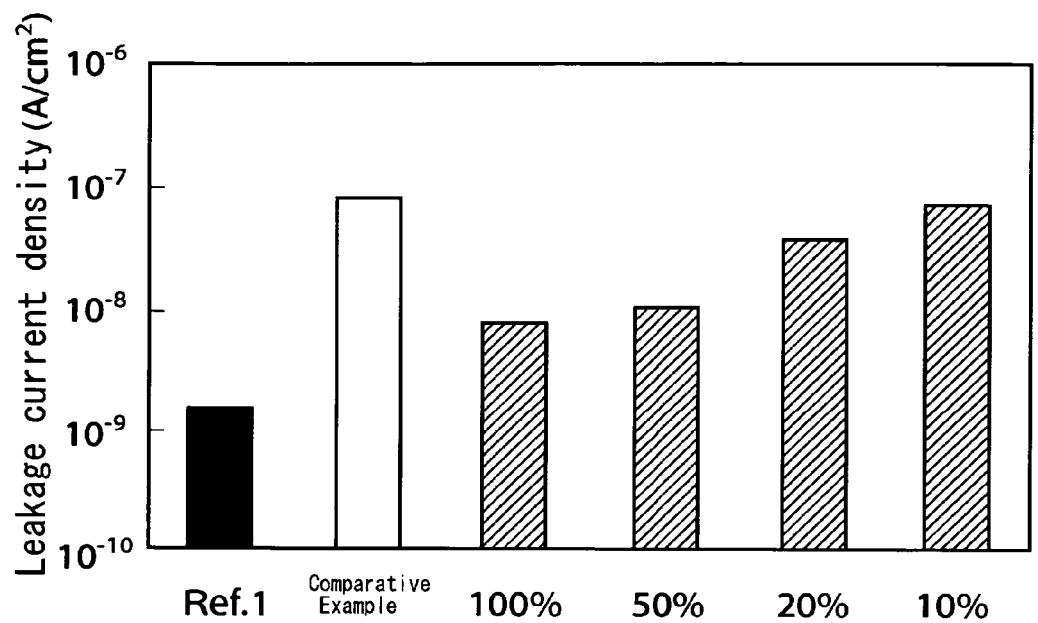
FIG. 6 is a diagram showing the relationship between the ethanol concentration and the leakage current density of the substrate.
Figure 7:
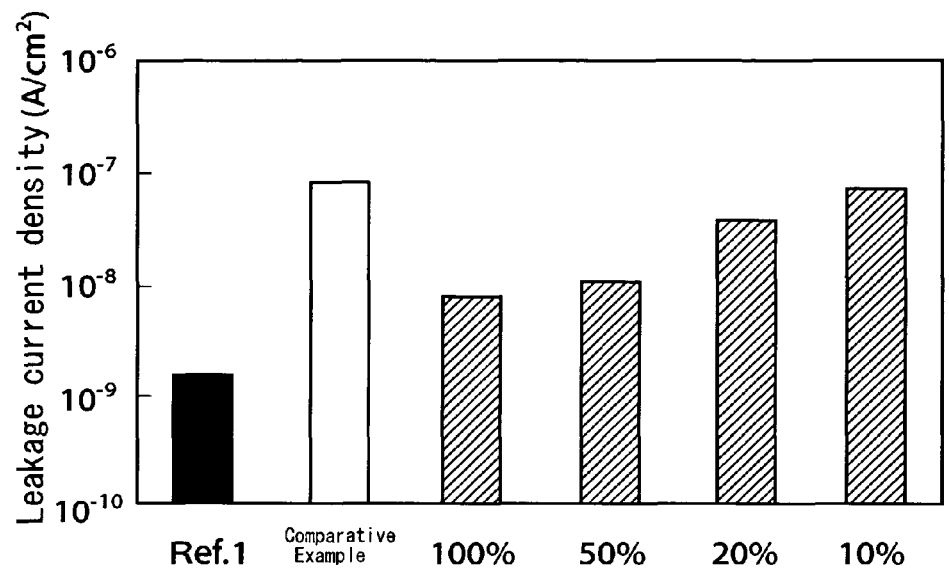
FIG. 7 is a diagram showing the relationship between the ethanol concentration and the leakage current density of the substrate.

Treatments were performed using the same method as in Embodiment A1 with the concentration of the ethanol solution being varied, and variations in the leakage current density in the substrate obtained in cases where an electric field of 1 MV/cm was applied were investigated. FIG. 6 shows the results obtained in a case where a silica film having an aperiodic structure was used as the interlayer insulating film 3, while FIG. 7 shows the results obtained in a case where a silica film having a periodic structure was used. The reference and comparative example are the same as in the case with Embodiments A and B. As is seen from FIG. 6, in the case of the ethanol solution, if the concentration was 50% or greater, it was possible to suppress the leakage current density to about 1/10 of that in the comparative example, which is a conventional method. Accordingly, it may be said that an effect was obtained.

The invention claimed is:

1. A method of CMP polishing an object in which a hydrophobized porous substance is used as an interlayer insulating film material of a semiconductor integrated circuit formed on a substrate, said method comprising the steps of
performing CMP polishing of the object to remove wiring materials and barrier metals;
removing slurry and polishing residue remaining on the surface of the substrate by cleaning with a cleaning liquid containing a surfactant;
washing the surface of the substrate with an organic solvent or a solution containing an organic solvent to remove organic matter which is in the cleaning liquid and has seeped into the interlayer insulating film in the removing step; and
performing heat treatment of the object in which the substrate is heated to a temperature that is equal to or greater than the thermal decomposition temperature of the organic matter which has seeped into the interlayer insulating film to decompose the organic matter.

2. The CMP polishing method according to claim 1, wherein a solvent containing at least one type of organic solvent selected from a set comprising alcohols, aldehydes, ketones, esters, ethers, amides, polyhydric alcohols and derivatives of the same, nitrogen-containing organic compounds, hydrocarbons, halogenated hydrocarbons, and fluorine compounds is used as the organic solvent described above.

3. The CMP polishing method according to claim 1, wherein the heat treatment is a heat treatment performed under reduced pressure.

4. The CMP polishing method according to claim 1, wherein the substrate is placed in an inert gas during the heat treatment.

5. The CMP polishing method according to claim 1, wherein the temperature to which the substrate is heated is equal to or greater than the thermal decomposition temperature of the organic matter and equal to or less than 400° C.

* * * * *